United States Patent
Peterson et al.

(10) Patent No.: US 6,801,300 B2
(45) Date of Patent: Oct. 5, 2004

(54) SYSTEM AND METHOD FOR SWITCHING POSITION SIGNALS DURING SERVO CONTROL OF A DEVICE TABLE

(75) Inventors: John Peterson, Woodside, CA (US); Gabor Szoboszlay, Santa Clara, CA (US); Andrew J. Hazelton, San Carlos, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/930,530

(22) Filed: Aug. 14, 2001

(65) Prior Publication Data

US 2003/0035093 A1 Feb. 20, 2003

(51) Int. Cl.[7] .................. G03B 27/58; G03B 27/42; G03B 27/62; G05B 19/10
(52) U.S. Cl. ................. 355/72; 355/53; 355/75; 318/567
(58) Field of Search ............... 355/53, 72–76; 356/358, 399–401; 310/10, 12; 378/34; 318/567, 649

(56) References Cited

U.S. PATENT DOCUMENTS 5,548,195 A * 8/1996 Doran .................. 318/568.19
6,008,882 A * 12/1999 Ito et al. ........................ 355/53
6,211,965 B1 * 4/2001 Tsuchiya et al. ............. 356/493
6,259,511 B1 * 7/2001 Makinouchi et al. ......... 355/53
6,323,935 B1 * 11/2001 Ebihara et al. ................ 355/53

FOREIGN PATENT DOCUMENTS

| JP | 2-73111 | 3/1990 |
| WO | WO 88/06712 | 9/1988 |

* cited by examiner

Primary Examiner—Henry Hung Nguyen
(74) Attorney, Agent, or Firm—Steven G. Roeder; Jim Rose

(57) ABSTRACT

A stage assembly (10) for moving a device (26) along an X axis and a Y axis includes a stage base (12), a device table (16), a stage mover assembly (18), a measurement system (21), and a control system (22). The stage mover assembly (18) includes a pair X guide movers (82) (84) and a Y table mover (87). The measurement system (21) includes a first X system (100) and a second X system (102). The control system (22) receives the position signals from the measurement system (21) and directs current to the X movers (82) (84) to move the device table along the X axis. The control system (22) can be designed to not skip any servo cycles during switching of position signals.

80 Claims, 9 Drawing Sheets

SYSTEM AND METHOD FOR SWITCHING POSITION SIGNALS DURING SERVO CONTROL OF A DEVICE TABLE

FIELD OF THE INVENTION

The present invention is directed to a stage assembly for moving a device. More specifically, the present invention is directed to a system and method for switching position signals during movement of a device table of a stage assembly.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly, a wafer stage assembly that retains a semiconductor wafer, a measurement system, and a control system. The reticle stage assembly and the wafer stage assembly are supported above a ground with an apparatus frame.

Typically, the wafer stage assembly includes a wafer table that retains the wafer, and a wafer mover assembly that moves the wafer table and the wafer between an alignment region and an operational region. In the alignment region, the wafer is loaded onto the wafer table and the positions of the chips on the wafer relative to the wafer table are determined. In the operational region, the images from the reticle are transferred to the wafer.

The size of the images transferred onto the wafer from the reticle is extremely small. Accordingly, the precise relative positioning of the wafer and the reticle is critical to the manufacturing of high density, semiconductor wafers. In order to obtain precise relative positioning, the reticle and the wafer are constantly monitored by the measurement system. Stated another way, the measurement system monitors movement of the wafer table relative to the lens assembly or some other reference. With this information, the wafer mover assembly can be used to precisely position the wafer table.

The measurement system typically includes one or more interferometer systems for monitoring the position of the wafer table. For example, a typical wafer stage assembly includes an X interferometer for monitoring the position of the wafer table along an X axis and a Y interferometer for monitoring the position of the wafer table along a Y axis. Each interferometer generates one or more position signals to monitor the position of the wafer table in both the alignment region and the operational region. Using the position signals from the interferometers, the control system controls the wafer mover assembly to precisely position the wafer table and the wafer.

Recently, wafer stage assemblies have been developed which have a longer stroke between the alignment region and the operational region. These wafer stage assemblies allow for more space in both the alignment region and the operational region. Because of the longer stroke of the wafer stage assembly, two X interferometers and/or two Y interferometers are necessary to monitor the position of the wafer table. In this design, the one X interferometer and one Y interferometer monitor the position of the wafer table when the wafer table and the wafer are in the alignment region and the other X interferometer and the other Y interferometer monitor the position of the wafer table when the wafer table and the wafer are in the operational region.

Unfortunately, the wafer mover assembly can abruptly and inaccurately move the wafer stage during the transition between the interferometers. This reduces the accuracy of positioning of the wafer and degrades the accuracy of the exposure apparatus.

In light of the above, there is a need for a stage assembly that precisely positions a device. Additionally, there is a need for a method and system for controlling the wafer mover assembly while switching between position signals of the interferometers. Moreover, there is a need for an exposure apparatus capable of manufacturing precision devices such as high density, semiconductor wafers.

SUMMARY

The present invention is directed to a stage assembly that moves a device along an X axis and a Y axis between a first region, a transition region, and a second region. The stage assembly includes a device table, a X mover, a Y mover, a measurement system, and a control system. The device table retains the device. The X mover is connected to the device table and moves the device table along the X axis. The Y mover is connected to the device table and moves the device table along the Y axis.

The measurement system monitors the position of the device table. As provided herein, the measurement system includes a first X system and a second X system. The first X system provides a first X position signal that indicates the position of the device table along the X axis when the device table is in the first region and the transition region. The second X system provides a second X position signal that indicates the position of the device table along the X axis when the device table is in second region and the transition region.

The control system is connected to the movers and the measurement system. With this design, the control system receives the position signals from the X systems and directs current to the X mover and the Y mover to move the device table along the X axis and the Y axis between the first region and the second region with a plurality of servo cycles. To avoid an interruption in the position signal, both X systems provide a position signal in the transition region. This allows the first X system to be used to provide the position signal while the second position signal of the second X system is reset and offset to match the first X system. Only then is the positioning servo switched. Stated another way, the overlap between the first and second X systems in the transition region is used to reset and offset one position signal while the position servo uses the other. Only then is the position servo switched to the other sensor system. This switching is very fast so no servo cycles are stopped. As a result thereof, the control system does not abruptly move the device table during the transition between X position signals. Further, the stage assembly can be used in an exposure apparatus to manufacture high density, high quality semiconductor wafers.

Preferably, the X mover is moving the device table at a substantially constant velocity in the transition region. As a result thereof, there is no reduction in throughput of the exposure apparatus.

In an alternate embodiment, the control system does not direct current to the X mover during at least one cycle when the device table is in the transition region. In this embodiment, the control system can utilize the information taken from the previous measurement to fill the servo hiccup. More specifically, immediately before the transfer, the first X system provides the first X position signal that indicates the position of the device table to the control system. Further, immediately after the transfer to the second X system, the control system utilizes the previously measured first X position signal taken with the first X system. Subsequently, the control system utilizes the second X position signal taken with the second X system to control the X mover.

In another embodiment, the measurement system includes a third system that monitors the position of the device stage. In this embodiment, during the transfer between the systems, the control system relies upon the measurements taken with the third system to control the movers and the position of the device stage along the axis. More specifically, just before the transfer, the measurement system measures the position of the device stage along the axis with the first system and the position of the device stage relative to the guide assembly with the third system. Next during the transfer, the control system monitors movement of the device stage relative to the guide assembly with the third system. Finally, the control system uses the second system to monitor the position of the device stage along the axis.

The present invention is also directed to a method for making a stage assembly, a method for making an exposure apparatus, a method for making a device, a method for manufacturing a wafer, and a method for controlling the movement of a device table.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
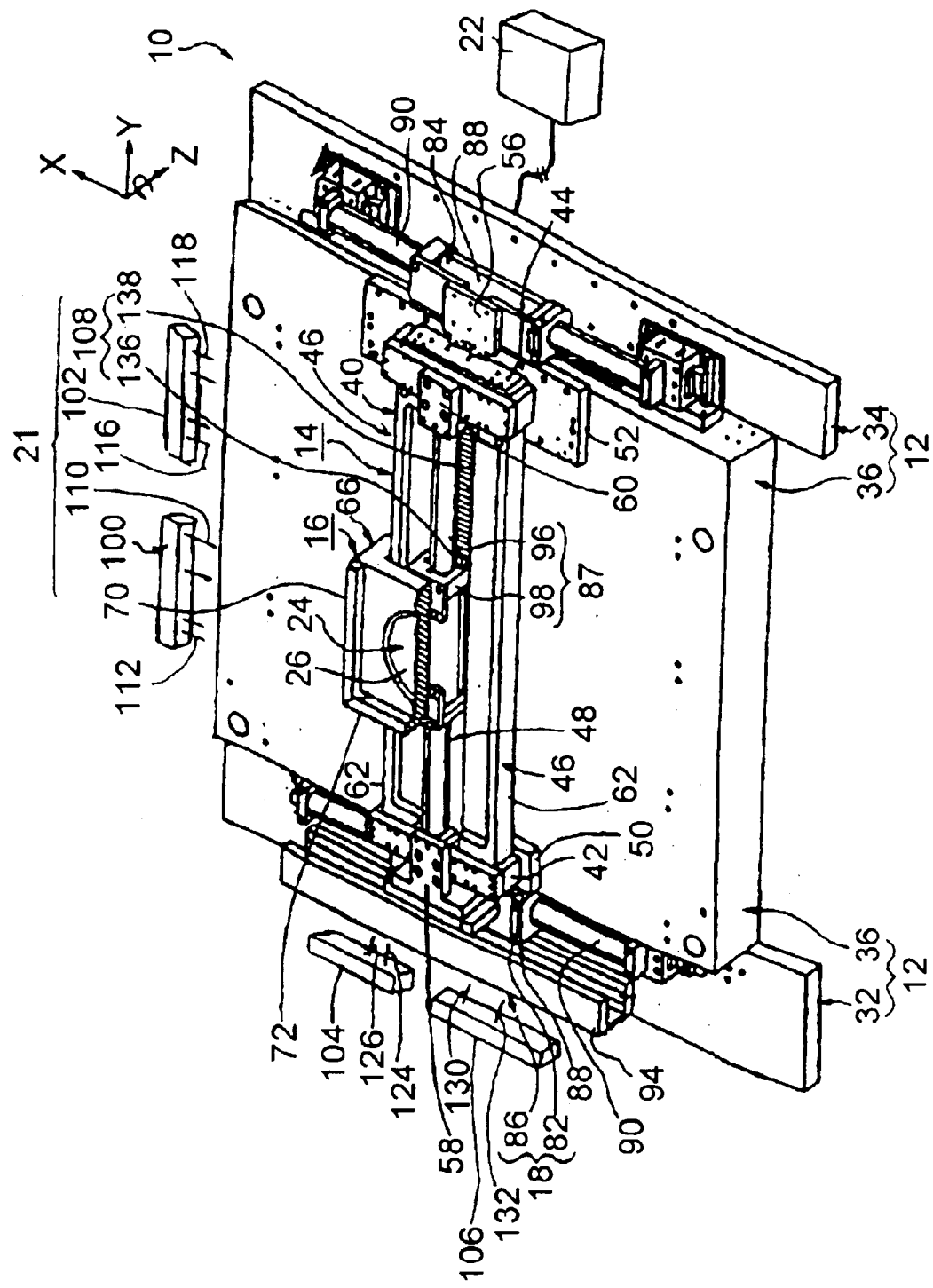
FIG. 1 is a perspective view, in partial cut-away, of a stage assembly having features of the present invention.
Figure 2:
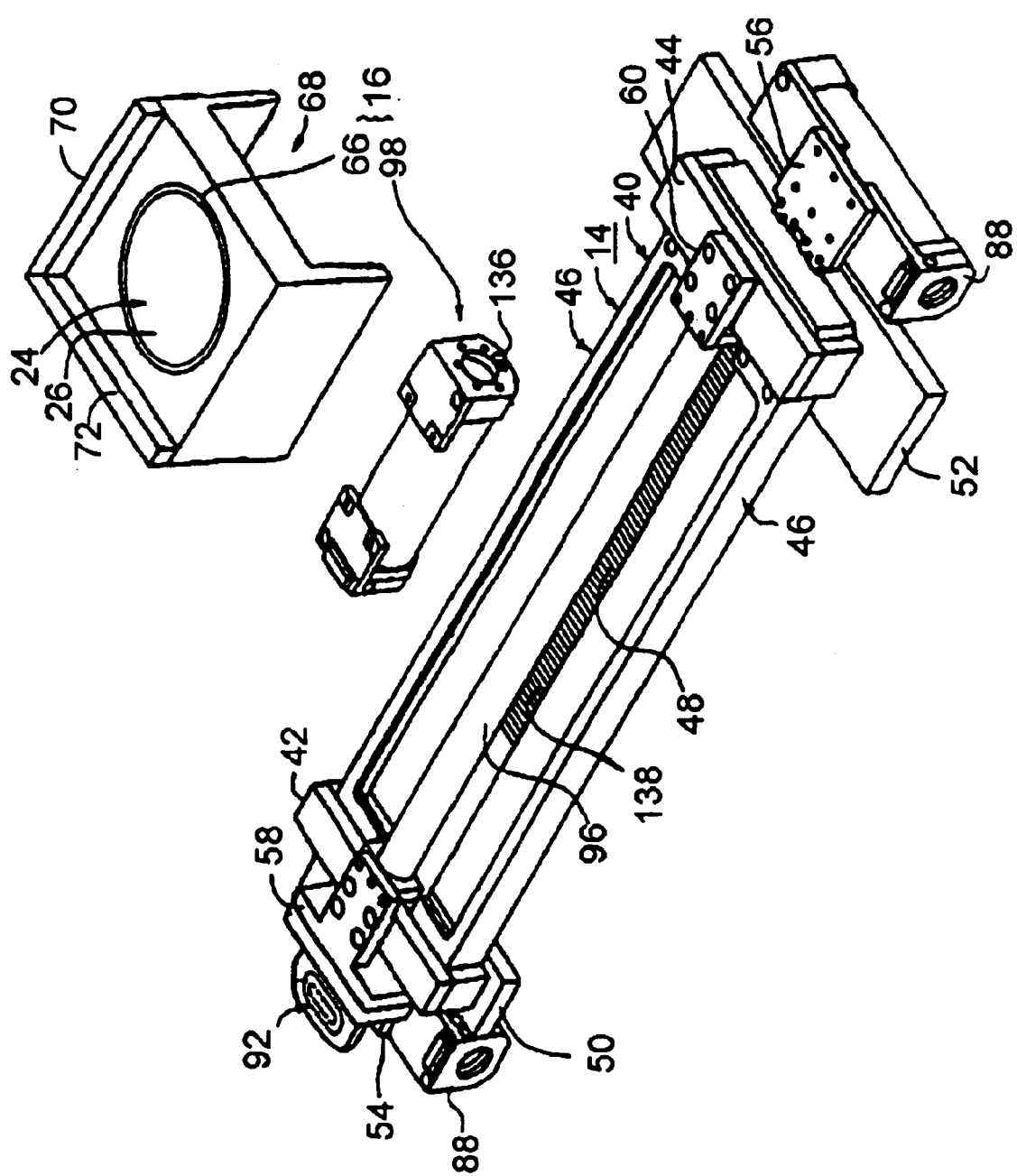
FIG. 2 is an exploded, perspective view of a portion of the stage assembly of FIG. 1.

Referring initially to FIGS. 1 and 2, a stage assembly 10 having features of the present invention includes a stage base 12, a guide assembly 14, a device table 16, a stage mover assembly 18, a mounting base 20 (illustrated in FIG. 5), a measurement system 21 and a control system 22. As an overview, the stage mover assembly 18 moves the device table 16 relative to the stage base 12 and the mounting base 20. The measurement system 21 monitors movement of the device table 16. The control system 22 controls the stage mover assembly 18 to precisely position the device table 16 relative to the stage base 12.

The stage assembly 10 is particularly useful for precisely positioning a device 24 during a manufacturing and/or an inspection process. The type of device 24 positioned and moved by the stage assembly 10 can be varied. For example, each device 24 can be a semiconductor wafer 26 and the stage assembly 10 can be used as part of an exposure apparatus 28 (illustrated in FIG. 5) for precisely positioning the semiconductor wafer 26 relative to a reticle 30 (illustrated in FIG. 5) during manufacturing of the semiconductor wafer 26. Alternately, for example, the stage assembly 10 can be used to move other types of devices 24 during manufacturing, to move a device under an electron microscope (not shown), to move a device during a precision measurement operation (not shown), or to move a device during a precision manufacturing operation.

The stage mover assembly 18 provided herein moves and positions the device table 16 and the device 24 along the X axis, along the Y axis and about the Z axis under the control of the control system 22. More specifically, referring to FIG. 3, the stage mover assembly 18 moves the device table 16 and the device 24 between a first region 31A, a second region 31B and a transition region 31C. For an exposure apparatus 28, in the first region 31A, the wafer 26 is loaded on the device table 16. Next, the positions of the chips on the wafer 26 relative to the device table 16 is determined: Subsequently, the device table 16 and the wafer 26 are moved by the stage mover assembly 18 to the second region 31B. In the second region 31B, images from the reticle 30 are transferred to the wafer 26.

Figure 4A:
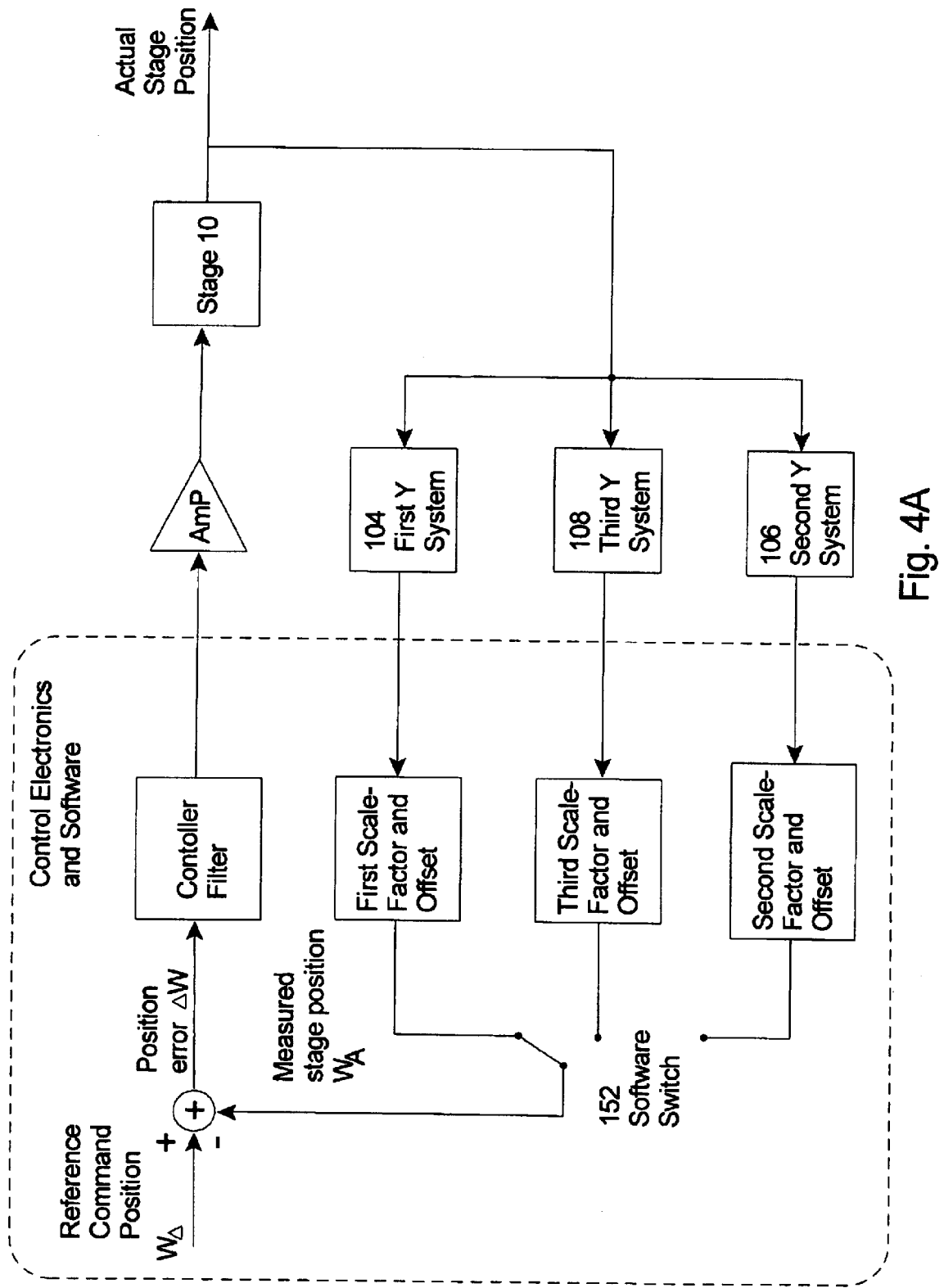
FIG. 4A is a simplified, control block diagram that illustrates a first embodiment of a control system having features of the present invention.

A couple of alternate embodiments of the control system 22 and methods used by the control system 22 for controlling the stage mover assembly 18 are provided herein. In particular, FIG. 4A illustrates a control flow chart that facilitates the discussion of a first method for controlling the stage mover assembly 18 and FIGS. 4B and 4C each illustrate a control flow chart that facilitates the discussion of a second method for controlling the stage mover assembly 18. The methods provided herein allow the control system 22 to precisely control the stage mover assembly 18. This improves the positioning performance of the stage assembly 10. Further, for an exposure apparatus 28, this allows for more accurate positioning of the semiconductor wafer 26 relative to the reticle 30.

In each embodiment illustrated herein, the stage assembly 10 includes a single device table 16 that is independently moved relative to the stage base 12. Alternately, however, the stage assembly 10 could be designed to include multiple device tables 16 that are moved independently.

Some of the Figures provided herein include a coordinate system that designates an X axis, a Y axis and a Z axis. It should be understood that the coordinate system is merely for reference and can be varied. For example, the X axis can be switched with the Y axis and/or the stage assembly 10 can be rotated.

The stage base 12 supports the guide assembly 14 and the device table 16. The design of the stage base 12 can be varied to suit the design requirements of the stage assembly 10. In the embodiment illustrated in FIG. 1, the stage base 12 includes a first base mount 32, a second base mount 34 spaced apart from the first base mount 32, and a base plate 36. Each base mount 32, 34 is generally flat plate shaped.

The base plate 36 is generally rectangular shaped and includes an upper planar surface. The base mounts 32, 34 are positioned on opposite sides of the base plate 36.

Figure 5:
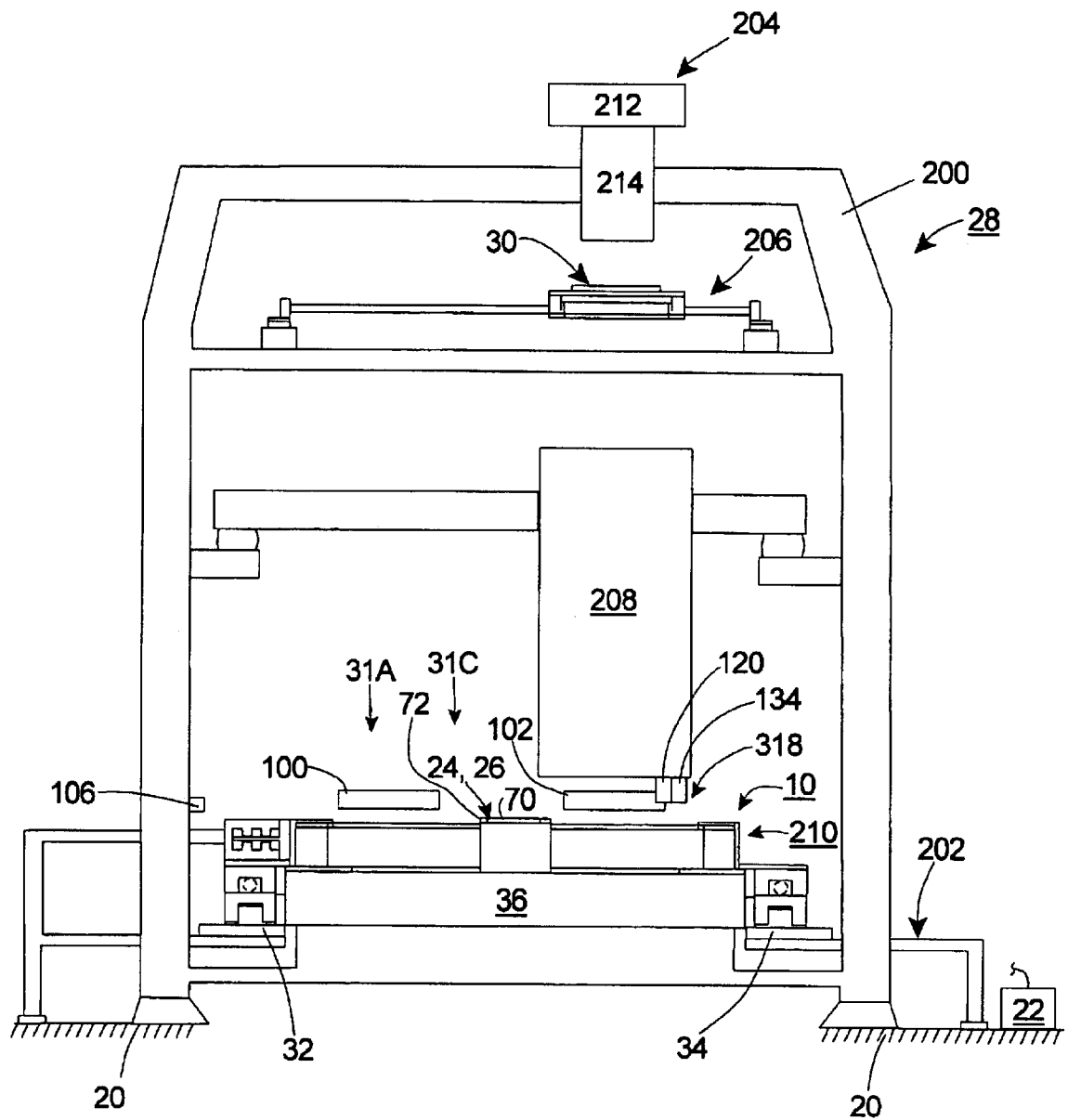
FIG. 5 is a schematic illustration of an exposure apparatus having features of the present invention.

The stage base 12 can be secured to the mounting base 20 with an apparatus frame 200 and a reaction frame 202 as illustrated in FIG. 5. In the embodiment illustrated in FIG. 5, each base mount 32, 34 is secured to the mounting base 20 with the reaction frame 202 and the base plate 36 is secured to the mounting base 20 with the apparatus frame 200. With this design, the reaction forces from the stage mover assembly 18 are transferred to the mounting base 20 with reaction frame 202. Alternately, for example, the base mounts and the base plate can both be secured to the apparatus frame. Still alternately, the base plate 36 can be mounted with an isolation system (not shown) that is connected to the mounting base 20.

The guide assembly 14 is moved relative to the stage base 12. The design of the guide assembly 14 can be varied to suit the design requirements of the stage assembly 10. In the embodiment illustrated in FIGS. 1 and 2, the guide assembly 14 includes a guide frame 40, a portion of the stage mover assembly 18, and a portion of the measurement system 21.

As can best be seen in FIG. 2, the guide frame 40 includes (i) a generally rectangular shaped first end block 42, (ii) a generally rectangular shaped second end block 44 spaced apart from the first end block 42, (iii) a pair of spaced apart, substantially parallel guide bars 46 that extend between the end blocks 42, 44, (iv) a flat, intermediate bar 48 that extends between the end blocks 42, 44 substantially parallel with the guide bars 46, (iv) a first bearing pad 50 positioned below the first end block 42, (v) a second bearing pad 52 positioned below the second end block 44, (vi) a first plate 54 that cantilevers away from the first bearing pad 50, (vii) a second plate 56 that cantilevers away from the second bearing pad 52, (viii) a first block mount 58 secured to the first end block 42, and (ix) a second block mount 60 secured to the second end block 44. The components of the guide frame 40 can be made of a number of materials, including ceramic, such as alumina or silicon carbide, metals such as aluminum, composite materials, or plastic.

Each guide bar 46 includes a side surface that is used to guide the device table 16. Each bearing pad 50, 52 includes a planar, pad bearing surface that is positioned adjacent to the upper planar surface of the base plate 36. In this embodiment, each of the bearing pads 50, 52 includes a plurality of spaced apart, fluid outlets (not shown) and a plurality of spaced apart, fluid inlets (not shown). Pressurized fluid (not shown) is released from the fluid outlets towards the base plate 36 and a vacuum is pulled in the fluid inlets to create a vacuum preload type, fluid bearing between each bearing pad 50, 52 and the base plate 36. The vacuum preload type, fluid bearing maintains the guide assembly 14 spaced apart along the Z axis relative to the base plate 36 and allows for motion of the guide assembly 14 along the X axis, the Y axis and about the Z axis relative to the base plate 36.

Alternately, the guide assembly 14 can be supported spaced apart from the base plate 36 by other ways. For example, a magnetic type bearing or roller type bearing could be utilized that allows for motion of the guide assembly 14 relative to the base plate 36.

The device table 16 moves relative to the guide assembly 14 along the Y axis. The design of the device table 16 can be varied to suit the design requirements of the stage assembly 10. In the embodiment illustrated in FIGS. 1 and 2, the device table 16 includes a stage frame 66, a device holder (not shown), a portion of the stage mover assembly 18 and a portion of the measurement system 21.

The stage frame 66 illustrated in FIG. 2 is generally cubed shaped and includes a top, a bottom and four sides. The stage frame 66 also includes a generally rectangular shaped, guide channel 68 that is sized and shaped to receive a portion of the stage mover assembly 18 and the guide bars 46. The guide channel 68 defines an upper surface and a pair of spaced apart, planar side surfaces. The device holder retains the device 24 during processing. The device holder can be a vacuum chuck or some other type of clamp.

Referring to FIGS. 1 and 2, the measurement system 21 includes an X mirror 70 and a Y mirror 72 that are secured to the stage frame 66. Each mirror 70, 72 is generally rectangular shaped. The X mirror 70 extends along one side of the device table 16 and the Y mirror 72 extends along another side of the device table 16. The X mirror 70 and the Y mirror 72 are typically substantially perpendicular.

In the embodiment illustrated in the Figures, the bottom of the stage frame 66 includes a plurality of spaced apart, fluid outlets (not shown) and a plurality of spaced apart, fluid inlets (not shown). Pressurized fluid (not shown) is released from the fluid outlets towards the base plate 36 and a vacuum is pulled in the fluid inlets to create a vacuum preload type, fluid bearing between the stage frame 66 and the base plate 36. The vacuum preload type, fluid bearing maintains the device table 16 spaced apart along the Z axis relative to the base plate 36 and allows for motion of the device table 16 along the X axis, along the Y axis and about the Z axis relative to the base plate 36.

Alternately, the device table 16 can be supported above the base plate 36 by other ways. For example, a magnetic type bearing or a roller type bearing could be utilized that allows for movement of the device table 16 relative to the guide assembly 14 and the base plate 36.

Also, in the embodiment illustrated in the Figures, each of the side surfaces that define the guide channel 68 includes a plurality of spaced apart, fluid outlets (not shown). Pressurized fluid (not shown) is released from the fluid outlets towards the bearing surface of each guide bar 46 to create a fluid bearing between the stage frame 66 and the guide bars 46. The fluid bearing maintains the device table 16 spaced apart from the guide assembly 14 along the X axis and allows for motion of the device table 16 along the Y axis relative to the guide assembly 14.

The stage mover assembly 18 moves the device table 16 under the control of the control system 22. More specifically, in the embodiment illustrated in FIG. 1, the stage mover assembly 18 moves the guide assembly 14 with a relatively large displacement along the X axis, a limited displacement along the Y axis, and a limited displacement about the Z axis (theta Z) relative to the base plate 36. Further, the stage mover assembly 18 moves the device table 16 with a relatively large displacement along the Y axis relative to the guide assembly 14 and the stage base 12. However, the design of the stage mover assembly 18 and the movement of the device table 16 can be varied to suit the movement requirements of the stage assembly 10. In the embodiment illustrated in FIGS. 1 and 2, the stage mover assembly 18 includes a first X guide mover 82, a second X guide mover 84, a Y guide mover 86 and a Y table mover 87. The guide movers 82, 84, 86 move the guide assembly 14 along the X axis, along the Y axis and about the Z axis. The Y table mover 87 moves the device table 16 relative to the guide assembly 14 along the Y axis.

The design of each guide mover 82, 84, 86 can be varied to suit the movement requirements of the stage assembly 10. As provided herein, each of the guide movers 82, 84, 86 can include one or more rotary motors, voice coil motors, linear motors, electromagnetic actuators, or some other force actuators. Typically, each X guide mover 82, 84 includes an X stage component 88 and an adjacent X base component 90 that interacts with the X stage component 88. Similarly, the Y guide mover 86 includes a Y stage component 92 and an adjacent Y base component 94 that interacts with the Y stage component 92.

The stage component 88, 92 of each guide mover 82, 84, 86 is secured to the guide frame 40, moves with the guide frame 40 and is part of the guide assembly 14. In contrast, the base components 90, 94 of each mover 82, 84, 86 is secured to the stage base 12. In each embodiment illustrated herein, the stage component 88, 92 moves relative to the corresponding base component 90, 94 of each guide mover 82, 84, 86. Additionally, in each embodiment, one of the components 88, 90, 92, 94 of each guide mover 82, 84, 86 includes one or more magnet arrays and the other component 88, 90, 92, 94 of each guide mover 82, 84, 86 includes one or more conductor arrays.

Electrical current (not shown) is individually supplied to each conductor in each conductor array by the control system 22. For each guide mover 82, 84, 86, the electrical current in each conductor interacts with a magnetic field (not shown) generated by one or more of the magnets in the magnet array. This causes a force (Lorentz force) between the conductors and the magnets that can be used to move the guide assembly 14 relative to the stage base 12.

Specifically, the X stage component 88 and the X base component 90 of each X mover 82, 84 interact to selectively move the guide assembly 14 and the device table 16 along the X axis and about the Z axis relative to the stage base 12. In the embodiment illustrated in the FIG. 1, each X mover 82, 84 is a shaft type, commutated, linear motor. The X stage component 88 for each X mover 82, 84 is secured to one of the end blocks 42, 44 and the X base component 90 for each X mover 82, 84 is secured to one of the base mounts 32, 34. In this embodiment, the X stage component 88 of each X guide mover 82, 84 includes a conductor array having a plurality of spaced apart conductors while the X base component 90 of each X guide mover 82, 84 includes a magnet array including a plurality of magnets. Alternately, for example, the configuration of the coil array and the magnet array can be reversed.

The Y guide mover 86 selectively moves the guide frame 40 along the Y axis relative to the stage base 12. In the embodiment illustrated in the Figures, the Y guide mover 86 is a non-commutated actuator, commonly referred to as a voice coil actuator. In this design, the Y stage component 92 is secured to the first end block 42 with the first block mount 58, and the Y base component 94 is secured to the first base mount 32. In this embodiment, the first Y stage component 92 includes a conductor array having a single conductor while the Y base component 94 includes a pair of spaced apart magnet arrays that are secured to a "C" shaped magnet mount. Alternately, the configuration of the coil array and the magnet array can be reversed. Still alternately, the Y guide mover 86 could be moved to the opposite side of the guide frame 40.

As provided above, the Y table mover 87 moves the device table 16 relative to the guide assembly 14 and the stage base 12 along the Y axis. The design of the Y table mover 87 can be varied to suit the movement requirements of the stage assembly 10. In the embodiments illustrated herein, the Y table mover 87 is a shaft type, commutated, linear motor and includes a guide Y component 96 and an adjacent table Y component 98 that interact to selectively move the device table 16 along the Y axis relative to the stage base 12 and the guide assembly 14.

In the design illustrated in FIGS. 1 and 2, the guide Y component 96 is secured to and extends between the end blocks 42, 44 of the guide assembly 14. In contrast, the table Y component 98 is secured to the stage frame 66, moves with the stage frame 66, and is part of the device table 16. One of the components 96, 98 of the Y table mover 87 includes one or more magnet arrays and the other component 98, 96 includes one or more conductor arrays. In the embodiment illustrated in the Figures, the Y component 96 includes a magnet array and the table Y component 98 includes a conductor array. Alternately, for example, the conductor array and the magnet array can be reversed.

The measurement system 21 monitors the position of the device table 16 relative to an optical assembly 208 (illustrated in FIG. 5) or some other reference. With this information, the control system 22 directs current to the stage mover assembly 18 to precisely position the device table 16. In the embodiment illustrated in FIG. 1, the measurement system 21 monitors the position of the device table 16 along the X axis, along the Y axis, and about the Z axis in both the first region 31A, the second region 31B and the transition region 31C.

The design of the measurement system 21 can be varied to suit the measurement requirements of the stage assembly 10. In the embodiment illustrated in the Figures, the measurement system 21 includes a first X system 100, a second X system 102, a first Y system 104, a second Y system 106 and a third Y system 108 to monitor the position of the device table 16.

The design of each system 100, 102, 104, 106, 108 can be varied. For example, each system 100, 102, 104, 106, 108 can be a laser interferometer, an encoder, and/or another type of measuring device that monitors the position of the device table 16. A suitable encoder and interferometer can be made with components obtained from Agilent Technologies in Palo Alto, Calif. or from Renishaw, Inc. in Schaumburg, Ill.

The first X system 100 monitors the position of the device table 16 along the X axis and about the Z axis when the device table 16 is in the first region 31A and the transition region 31C. In the embodiment illustrated in the Figures, the first X system 100 includes a first X interferometer block that (i) directs a pair of first X position laser beams 110 and detects the beams reflected off of the X mirror 70 secured to the device table 16 and (ii) directs a pair of first X reference laser beams 112 and detects the beams reflected off of a first X reference mirror (not shown). With this design, the first X system 100 generates a first X position signal that is transferred to the control system 22.

The second X system 102 monitors the position of the device table 16 along the X axis and about the Z axis when the device table 16 is in the second region 31B and the transition region 31C. In the embodiment illustrated in the Figures, the second X system 102 includes a second X interferometer block that (i) directs a pair of second X position laser beams 116 and detects the beams reflected off of the X mirror 70 and (ii) directs a pair of second X reference laser beams 118 and detects the beams reflected off of a second X reference mirror 120 (illustrated in FIG. 5) secured to the optical assembly 208. With this design, second X system 102 generates a second X position signal referenced to the optical assembly 208 that is transferred to the control system 22.

The first Y system 104 monitors the position of the device table 16 along the Y axis when the device table 16 is in the first region 31A. In the embodiment illustrated in the Figures, the first Y system 104 includes a first Y interferometer block that (i) directs a first Y position laser beam 124 and detects the beam reflected off of the Y mirror 72 secured to the device table 16 and (ii) directs a first Y reference laser beam 126 and detects the beam reflected off of a first Y reference mirror (not shown). With this design, the first Y system 104 generates a first Y position signal that is transferred to the control system 22.

The second Y system 106 monitors the position of the device table 16 along the Y axis when the device table 16 is in the second region 31B. In the embodiment illustrated in the Figures, the second Y system 106 includes a second Y interferometer block that (i) directs a second Y position laser beam 130 and detects the beam reflected off of the Y mirror 72 secured to the device table 16 and (ii) directs a second Y reference laser beam 132 and detects the beam reflected off of a second Y reference mirror 134 (illustrated in FIG. 5) that is secured to the optical assembly 208. With this design, the second Y system 106 generates a second Y position signal referenced to the optical assembly 208 that is transferred to the control system 22.

The third Y system 108 measures the position of the device table 16 relative to the guide assembly 14 along the Y axis in the first region 31A, the second region 31B and the transition region 31C. In the embodiment illustrated in the Figures, the third Y system 108 is commonly referred to as a linear encoder and includes a sensor 136 secured to the device table 16 and a sensor strip 138 secured to the guide assembly 14. The sensor 136 measures the amount of movement of device table 16 as the device table 16 and the sensor 136 moves relative to the sensor strip 138. Alternately, for example, the components of the third Y system 108 can be reversed or an interferometer system can be utilized.

Each X interferometer block is positioned away from the device table along the X axis and each Y interferometer block is positioned away from the device table 16 along the Y axis. The interferometer blocks can be secured to the apparatus frame 200 (illustrated in FIG. 5) or some other location that is preferably isolated from vibration.

The control system 22 receives the position signals from the measurement system 21 and controls the stage mover assembly 18 to move the device table 16 along the desired path to precisely position the device table 16 and the device 24. More specifically, in the embodiment illustrated in FIG. 1, the control system 22 directs and controls the current to the X guide movers 82, 84 to control movement of the guide assembly 14 and device table 16 along the X axis and about the Z axis. Similarly, the control system 22 directs and controls the current to the Y guide mover 86 to control movement of the guide assembly 14 along the Y axis. Finally, the control system 22 directs and controls the current to the Y table mover 87 to control movement of the device table 16 along the Y axis relative to the guide assembly 14.

The following symbols are used in conjunction with the discussion of the control system 22:

Wx is the position of the device table 16 along the X axis as measured by the first X system 100 or the second X system 102.

Wy is the position of the device table 16 along the Y axis as measured by the first Y system 104, the second Y system 106 and/or the third Y system 108.

W$\theta$z is the position of the device table 16 about the Z axis as measured by the first X system 100 or the second X system 102.

$W_A$ is actual, present location of the device table 16 and the device 24 measured with the measurement system 21. $W_A$ is determined from the Wx, Wy, W$\theta$z measurements taken by the measurement system 21.

$W_D$ is the desired location of the device table 16 and the device 24. $W_D$ is also referred to as the reference command position.

$\Delta W$ is the position error or error signal of the device table 16. $\Delta W$ is the difference between the desired location $W_D$ of the device table 16 and the actual, measured location $W_A$ of the device table 16. $\Delta W$ includes a $\Delta Wx$ component, a $\Delta Wy$ component, and a $\Delta W\theta z$ component. $\Delta Wx$ represents the difference between the desired location of the device table 16 and actual location of the device table 16 along the X axis. $\Delta Wy$ represents the difference between the desired location of the device table 16 and actual location of the device table 16 along the Y axis. $\Delta W\theta z$ represents the difference between the desired location of the device table 16 and actual location of the device table 16 about the Z axis.

F represents the force required by the stage mover assembly 18 to move the device table 16 from the actual location $W_A$ to the desired location $W_D$. F can be broken down into three components, namely $F_x$, $F_y$, $F\theta_z$. Fx represents a force by the X guide movers 82, 84 required to move the device table 16 from the actual location $W_A$ to the desired location $W_D$ along the X axis ($\Delta Wx$). Fy represents the force by the Y table mover 87 required to move the device table 16 from the actual location $W_A$ to the desired location $W_D$ along the Y axis ($\Delta Wy$). F$\theta$z represents the force by the X guide movers 82, 84 required to move the device table 16 from the actual location $W_A$ to the desired location $W_D$ about the Z axis ($\Delta W\theta z$).

The control system 22 adjusts the current to the stage mover assembly 18 to control movement of the device table 16 based on the actual location $W_A$ of the device table 16 relative to the desired location $W_D$ of the device table 16. First, the control system 22 calculates the position error $\Delta W$ by comparing the reference command position $W_D$ with the current position $W_A$ as measured by the measurement system 21. With the position error $\Delta W$, the control system 22 determines the force (F) required at the movers 82, 84, 86, and 87 to move the device table 16 to the desired position $W_D$. These forces $F_x$, $F_y$, $F\theta_z$ are applied to the movers 82, 84, 86, 106 and the device table 16 is moved towards the desired position $W_D$. This is considered a servo cycle. A typical servo cycle last between approximately 0.1 and 1.0 milliseconds. However, longer servo cycles can be utilized.

Subsequently, after a short time interval, typically between approximately 0.1 and 1.0 milliseconds, the control system 22 receives a new position signal from the measurement system 21 and the error signal $\Delta W$ changes. This time interval is typically the same as the servo cycle. With the new error signal $\Delta W$, the control system 22 determines the new F required at the movers 82, 84, 84, and 87 and the new forces $F_x$, $F_y$, $F\theta_z$ are applied in the next servo cycle.

As provided herein, the control system 22 continually receives new position signals from the measurement system 21, constantly compares the new, present location $W_A$ to the desired position $W_D$, constantly generates the position error $\Delta W$, and constantly adjusts the F generated by the stage mover assembly 18 so that the stage mover assembly 18 smoothly moves the device table 16 and the device 24 to the command position $W_D$ using a plurality of servo cycles.

The control system 22 can include a controller filter to process each position error $\Delta W$ and calculate the appropriate $F_x$, $F_y$, $F\theta_z$ so that the stage mover assembly 18 smoothly moves the device table 16 from the present location $W_A$ to the desired location $W_D$. The controller filter can be any controller known in the art such as a proportional-integral controller and/or other types of controllers.

The previous servo cycle terms are collectively called the history points of the servo loop.

The control system 22 can also include an amplifier that converts the error signal ΔW into a high current input to the stage mover assembly 18 to move the device table 16.

The actual position $W_A$ of the device table 16 is measured by the systems 100, 102, 104, 106, 108 of the measurement system 21. The particular systems 100, 102, 104, 106, 108 that are used is determined by the location of the device table 16 and is selectable by a software switch 152 within the control system 22. As provided above, the first X system 100 monitors the position of the device table 16 and the device 24 along the X axis and about the Z axis in the first region 31A and the transition region 31C and the second X system 102 monitors the position of the device table 16 and the device 24 along the X axis and about the Z axis in the second region 31B and the transition region 31C. The first Y system 104 monitors the position of the device table 16 and the device 24 along the Y axis in the first region 31A and the second Y system 106 monitors the position of the device table 16 and the device 24 along the Y axis in the second region 31B. Further, the third Y system 108 monitors the position of the device table 16 along the Y axis in both the first region 31A, the second region 31B and the transition region 31C. As a result thereof, in order to precisely position the device table 16 along the X axis and about the Z axis, the control system 22 must control the X guide movers 82, 84 during the transition between measurements taken from the first X system 100 and the second X system 102 and the control system 22 must determine how measurements taken with the second X system 102 correspond to measurements taken with the first X system 100. Similarly, in order to precisely position the device table 16 along the Y axis, the control system 22 must (i) control the Y movers 86, 87 during the transition between measurements taken with the first Y system 104 and the third Y system 108, (ii) control the Y movers 86, 87 during the transition between measurements taken with the third Y system 108 and the second Y system 106, and (iii) determine how measurements with the third Y system 108 and the second Y system 106 correspond to measurements from the first Y system 104.

Figure 3:
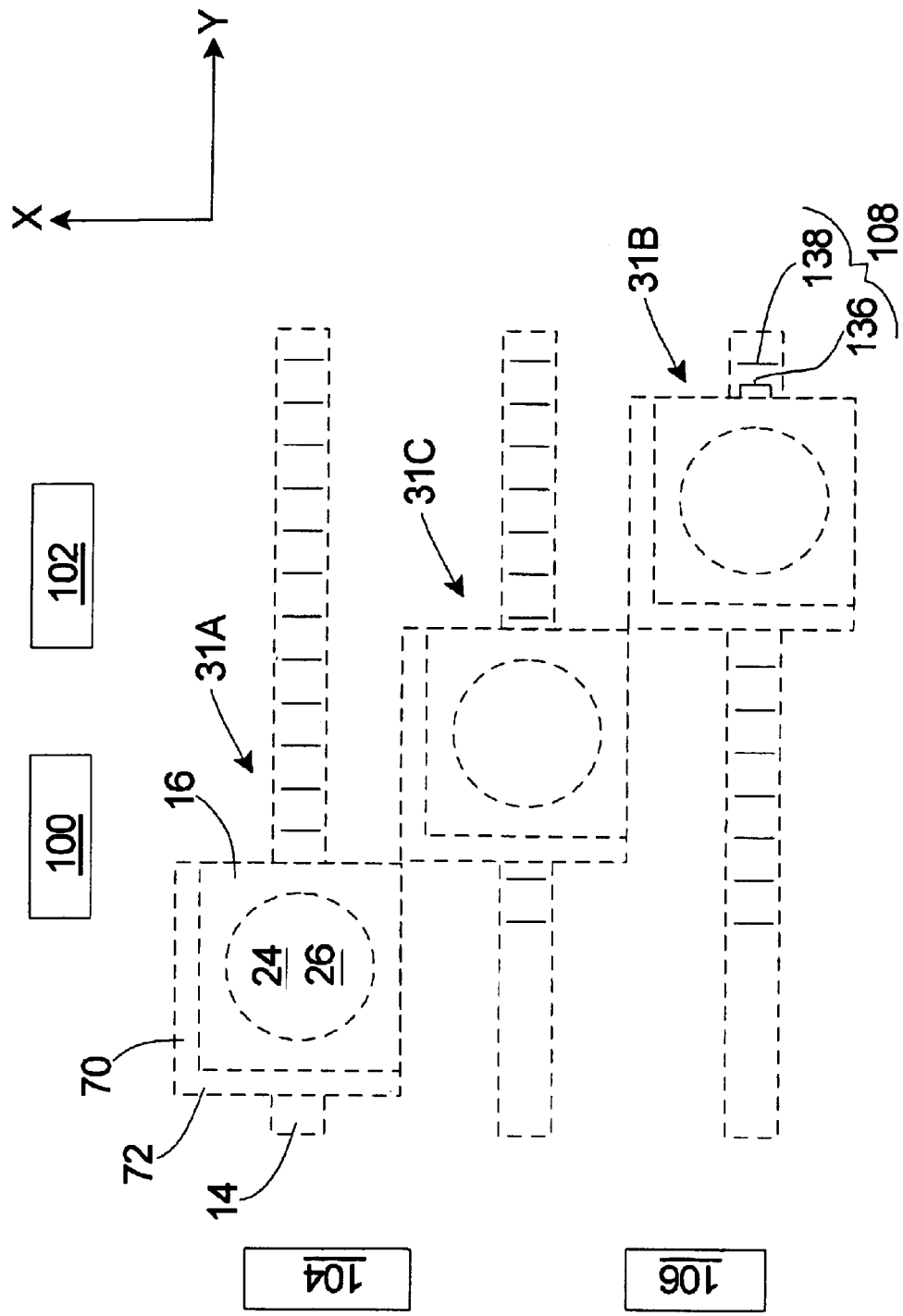
FIG. 3 is a simplified top plan illustration of the device table and guide assembly, in phantom, in a first region, a second region, and a transition region.
Figure 4B:
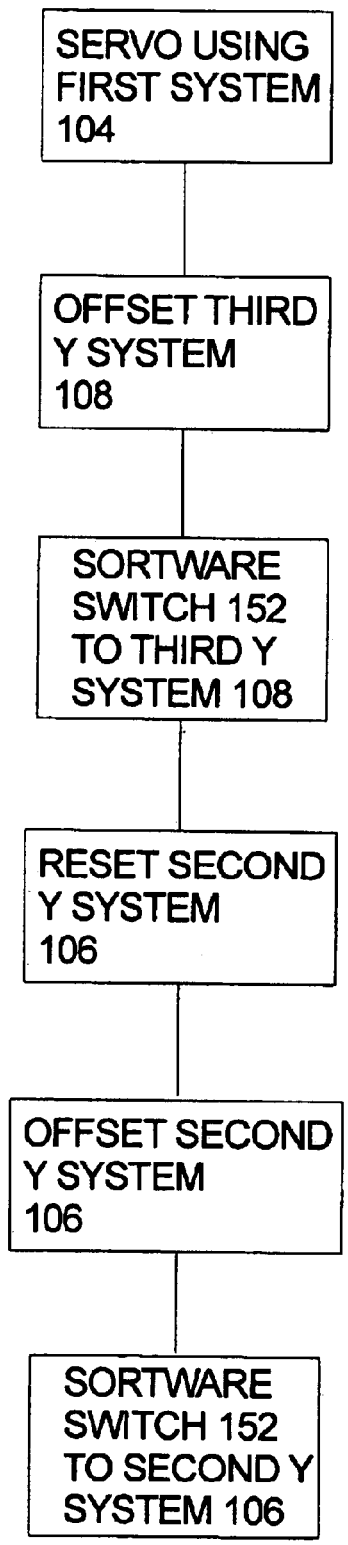
FIG. 4B is a simplified control block diagram that illustrates a second embodiment of the control system having features of the present invention.
Figure 4C:
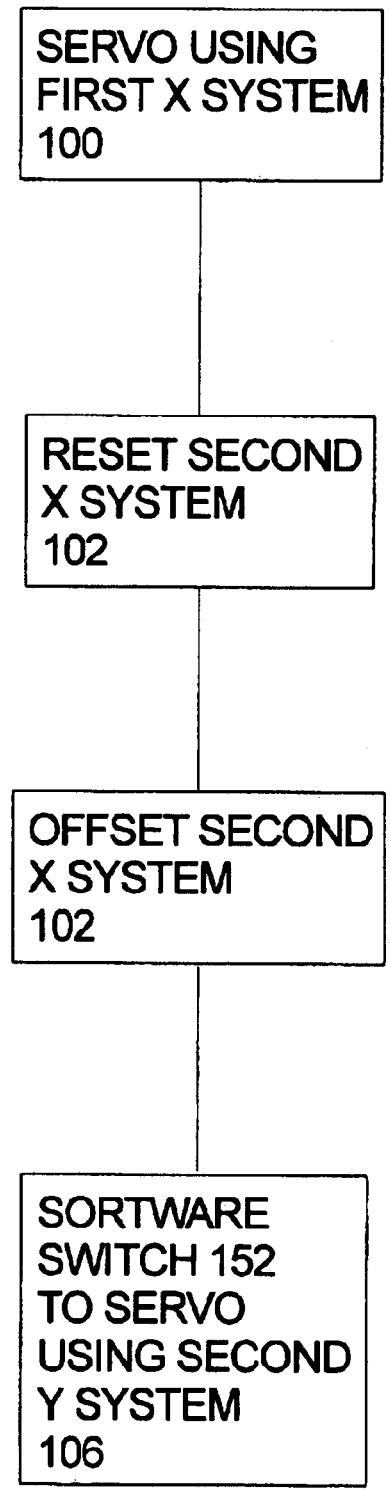
FIG. 4C is another simplified control block diagram that illustrates the second embodiment of the control system.

FIG. 3 illustrates a simplified schematic top view of the device table 16 illustrated in the first region 31A, the second region 31B and the transition region 31C between the first region 31A and the second region 31B, respectively to facilitate discussion of the control system 22. FIGS. 4A–4C each illustrate control block diagrams for the control system 22. It should be noted that the regions 31A–31C for the X systems 100, 102 may differ from the regions 31A–31C for the Y systems 104, 106, 108.

Initially, with the device table 16 in the first region 31A, the control system 22 receives position signals from the first X system 100 and the first Y system 104 to determine the actual location $W_A$ of the device table 16. Moreover, the third Y system 108 also provides information regarding location of the device table 16 along the Y axis. The control system 22 compares the actual location $W_A$ to the desired location $W_D$ to generate the error signal ΔW. With the error signal ΔW, the control system 22 determines the force (F), including $F_x$, $F_y$, $F_z$ needed at the movers 82, 84, 86, 87 to move the device stage 16 from the present location $W_A$ to the desired location $W_D$.

Next, after the predetermined time interval, the control system 22 receives new measurement signals from the first X system 100 and the first Y system 104 and determines the new actual location $W_A$ of the device table 16. The control system 22 compares the new actual location $W_A$ to the desired location $W_D$ to generate the new error signal ΔW. With the new error signal ΔW, the control system 22 directs the current to the stage mover assembly 18 to move the device table 16 from the actual location towards the desired location. This process is repeated as the stage mover assembly 18 moves the device table 16 to the desired position $W_D$.

For movement along the Y axis, in the first region 31A, the control system 22 compares a reference command position $W_D$ of the device table 16 and device 24 with the current position $W_A$ as measured by the first Y system 104 to generate ΔWy. Subsequently, with ΔWy, the control system 22 determines the $F_Y$ and adjusts the current to the Y guide mover 86 to move the device table 16 along the Y axis.

During movement along the Y axis from the first region 31A to the second region 31B, the control system 22 initially relies upon the first Y position signal from the first Y system 104 when the device table 16 is in the first region 31A. Next, the control system 22 relies upon the third Y position signal from the third Y system 108 when the device table 16 is in the transition region 31C. Finally, the control system 22 relies upon the second Y position signal from the second Y system 106 when the device table 16 is in the second region 31B. It should be noted that the third Y system 108 provides the third Y position signal n the first region 31A, the second region 31B and the transition region 31C.

To switch from the first Y system 104 to the third Y system 108, the control system 22 uses the position signal from the first Y system 104 at the end of the first region 31A while entering the transition region 31C with the third Y system 108. The third Y position signal is offset to match the first Y position signal. Additionally, there is a scale factor multiplying the third Y position signal if a different sensor resolution is used (e.g. the encoder is coarser). These tasks can be performed quickly by the control system 22, always within at least one servo cycle, so the system will not be delayed. After these events occur (effectively simultaneously), the control system 22 can be switched to rely on the Y position signals from the third Y system 108.

To switch from the third Y system 108 to the second Y system 106 at the beginning of the second region 31B while leaving the transition region 31C, the servo controller 22 uses the position signal from the third Y system 108 while resetting the second Y system 106. The second Y position signal from the second Y system 106 must be offset to read the same as the third Y position signal from the third Y system 108. If the resolution of the second Y system 106 and the third Y system 108 are different, then a scale-factor multiplying the second sensor is included. Additionally, the second Y system 106 error signal must be cleared by sending a command to the electronics of the second Y system 106. After these events occur, the control system 22 can be switched to rely on the Y position signals from the second Y system 106. These tasks are performed within at least one servo cycle.

The switch between Y systems 104, 106, 108 can occur during movement of the device table 16 at a constant velocity by the Y table mover 87 of the stage mover assembly 18 along the Y axis. Further, the position signal switching can occur without skipping servo cycles. As a result thereof, there is no spike in the movement and no reduction in the throughput of the system.

Alternate designs of the control system 22 can be utilized. For example, in an alternate design of the control system, to switch from the first Y system 104 to the third Y system 108, several changes must be made within the servo software of the control system 22. For example, (i) the servo parameters must be adjusted because the resolution of the third Y system 108 (e.g. encoder) is coarser than the first Y system 104, (ii) the history points must be flushed from the controller (and possibly regenerated) to prevent any discontinuity in the control output signal, and (iii) the third Y position signal from the third Y system 108 must be offset to read the same as the first Y position signal from the first Y system 104. Somewhat similarly, to switch from the third Y system 108 to the second Y system 106, (i) the servo parameters must be adjusted because the resolution of the third Y system 108 (e.g. encoder) is coarser than the second Y system 106, (ii) the history points must be flushed from the controller (and possibly regenerated) to prevent any discontinuity in the control output signal, and (iii) the second Y position signal from the second Y system 106 is offset to read the same as the third Y position signal from the third Y system 108.

In one embodiment, the control system 22 does not direct current to the Y table mover 87 for at least one servo cycle during the transfer between the first Y system 104 and the third Y system 108. Similarly, the control system 22 does not direct current to the Y table mover 87 for at least one servo cycle during the transfer between the third Y system 108 and the second Y system 106. Thus, the device table 16 is moved open loop along the Y axis during the skipped servo cycles.

To switch from the first X system 100 to the second X system 102, several changes must be made within the servo software of the control system 22.

For movement along the X axis, in the first region 31A, the control system 22 compares a reference command position $W_D$ of the device table 16 and device 24 with the current position $W_A$ as measured by the first X system 100 to generate a X position error. Subsequently, with the X position error, the control system 22 determines the $F_x$ and $F\theta_z$ and adjusts the current to the X guide movers 82, 84 to move the device table 16 along the X axis.

During movement along the X axis from the first region 31A to the second region 31B, the control system 22 initially relies upon the first X position signal from the first X system 100 when the device table 16 is in the first region 31A. Next, the control system 22 relies upon the first X position signal from the first X system 100 when the device table 16 is in the transition region 31C. Finally, the control system 22 relies upon the second X position signal from the second X system 102 when the device table 16 is in the second region 31B. It should be noted that both the X systems 100, 102 provide an X position signal in the transition region 31C.

To switch from the first X system 100 to the second X system 102, several changes must be made within the servo software of the control system 22. For example, (i) the history points must be flushed from the controller (and possibly regenerated) to prevent any discontinuity in the control output signal, and (ii) the second X position signal from the second X system 102 must be offset to read the same as the first X position signal from the first X system 100. These tasks can be performed quickly by the control system 22, usually within one servo cycle, so the system will not be delayed. After these events occur (effectively simultaneously), the control system 22 can be switched to rely on position signals from the second X system 102.

Preferably, the switch between X systems 100, 102 occurs during movement of the device table 16 at a constant velocity by the X guide movers 82, 84, by the stage mover assembly 18 along the X axis.

In an alternate embodiment, the control system 22 does not direct current to the X guide movers 82, 84 for at least one servo cycle during the transfer between the first X system 100 and the second X system 102. In this embodiment, the device table 16 is moved open loop along the X axis during the skipped servo cycles. As a result thereof, there is no spike in the movement and no reduction in the throughput of the system.

FIG. 5 is a schematic view illustrating an exposure apparatus 28 useful with the present invention. The exposure apparatus 28 includes the apparatus frame 200, the reaction frame 202, an illumination system 204 (irradiation apparatus), a reticle stage assembly 206, the optical assembly 208, and a wafer stage assembly 210. The stage assembly 10 provided herein can be used as the wafer stage assembly 210. Alternately, the stage assembly 10 provided herein can be modified for use as the reticle stage assembly 206.

The exposure apparatus 28 is particularly useful as a lithographic device that transfers a pattern (not shown) of an integrated circuit from the reticle 30 onto the semiconductor wafer 26. The exposure apparatus 28 mounts to the mounting base 20, e.g., the ground, a base, or floor or some other supporting structure.

The apparatus frame 200 is rigid and supports the components of the exposure apparatus 28. The design of the apparatus frame 200 can be varied to suit the design requirements for the rest of the exposure apparatus 28. The apparatus frame 200 illustrated in FIG. 5 supports the optical assembly 208 and the illumination system 204 above the mounting base 20.

The illumination system 204 includes an illumination source 212 and an illumination optical assembly 214. The illumination source 212 emits a beam (irradiation) of light energy. The illumination optical assembly 214 guides the beam of light energy from the illumination source 212 to the optical assembly 208. The beam illuminates selectively different portions of the reticle and exposes the wafer. In FIG. 5, the illumination source 212 is illustrated as being supported above the reticle stage assembly 206. Typically, however, the illumination source 212 is secured to one of the sides of the apparatus frame 200 and the energy beam from the illumination source 212 is directed to above the reticle stage assembly 206 with the illumination optical assembly 214.

The optical assembly 208 projects and/or focuses the light passing through the reticle to the wafer. Depending upon the design of the exposure apparatus 28, the optical assembly 208 can magnify or reduce the image illuminated on the reticle.

The reticle stage assembly 206 holds and positions the reticle 30 relative to the optical assembly 208 and the wafer 26. Similarly, the wafer stage assembly 210 holds and positions the wafer 26 with respect to the projected image of the illuminated portions of the reticle 30. In FIG. 5, the wafer stage assembly 210 utilizes a stage assembly 10 having features of the present invention. Depending upon the design, the exposure apparatus 28 can also include additional motors to move the stage assemblies 210, 206. Therefore, the present invention can also be applied to the reticle stage assembly 206 to position the reticle accuracy.

There are a number of different types of lithographic devices. For example, the exposure apparatus 28 can be used as scanning type photolithography system that exposes the pattern from the reticle onto the wafer with the reticle and wafer moving synchronously. In a scanning type lithographic device, the reticle is moved perpendicular to an optical axis of the optical assembly 208 by the reticle stage assembly 206 and the wafer is moved perpendicular to an optical axis of the optical assembly 208 by the wafer stage assembly 210. Scanning of the reticle and the wafer occurs while the reticle and the wafer are moving synchronously.

Alternately, the exposure apparatus 28 can be a step-and-repeat type photolithography system that exposes the reticle while the reticle and the wafer are stationary. In the step and repeat process, the wafer is in a constant position relative to the reticle and the optical assembly 208 during the exposure of an individual field. Subsequently, between consecutive exposure steps, the wafer is consecutively moved by the wafer stage perpendicular to the optical axis of the optical assembly 208 so that the next field of the wafer is brought into position relative to the optical assembly 208 and the reticle for exposure. Following this process, the images on the reticle are sequentially exposed onto the fields of the wafer so that the next field of the wafer is brought into position relative to the optical assembly 208 and the reticle.

However, the use of the exposure apparatus 28 provided herein is not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 208 included in the photolithography system, the optical assembly 208 need not be limited to a reduction system. It could also be a 1x or magnification system.

With respect to an optical assembly 208, when far ultra-violet rays such as the excimer laser is used, glass materials such as quartz and fluorite that transmit far ultra-violet rays is preferable to be used. When the $F_2$ type laser or x-ray is used, the optical assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. Patent Application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 6:
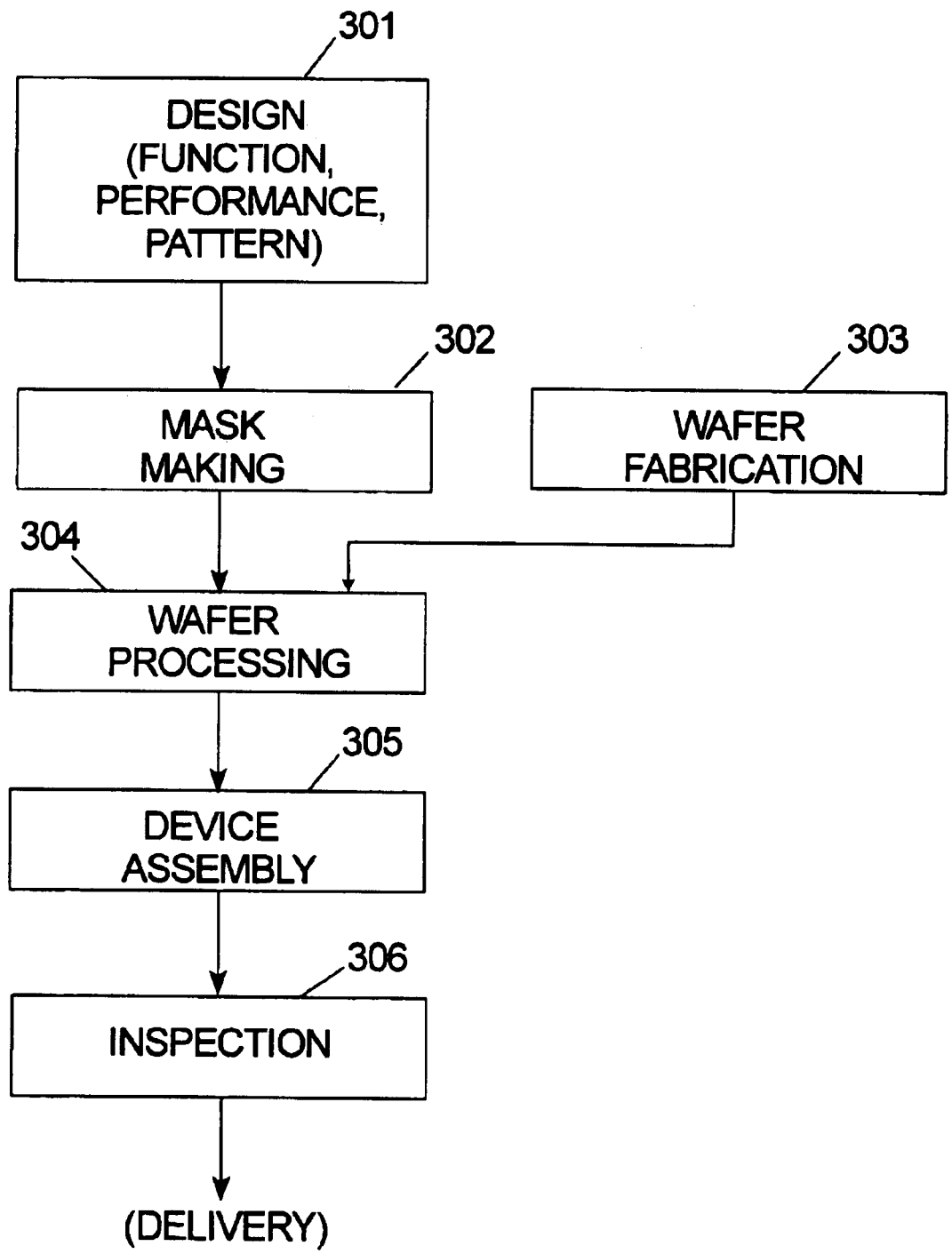
FIG. 6 is a flow chart that outlines a process for manufacturing a device in accordance with the present invention.

Further, semiconductor devices can be fabricated using the above described systems, by the process shown generally in FIG. 6. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 7:
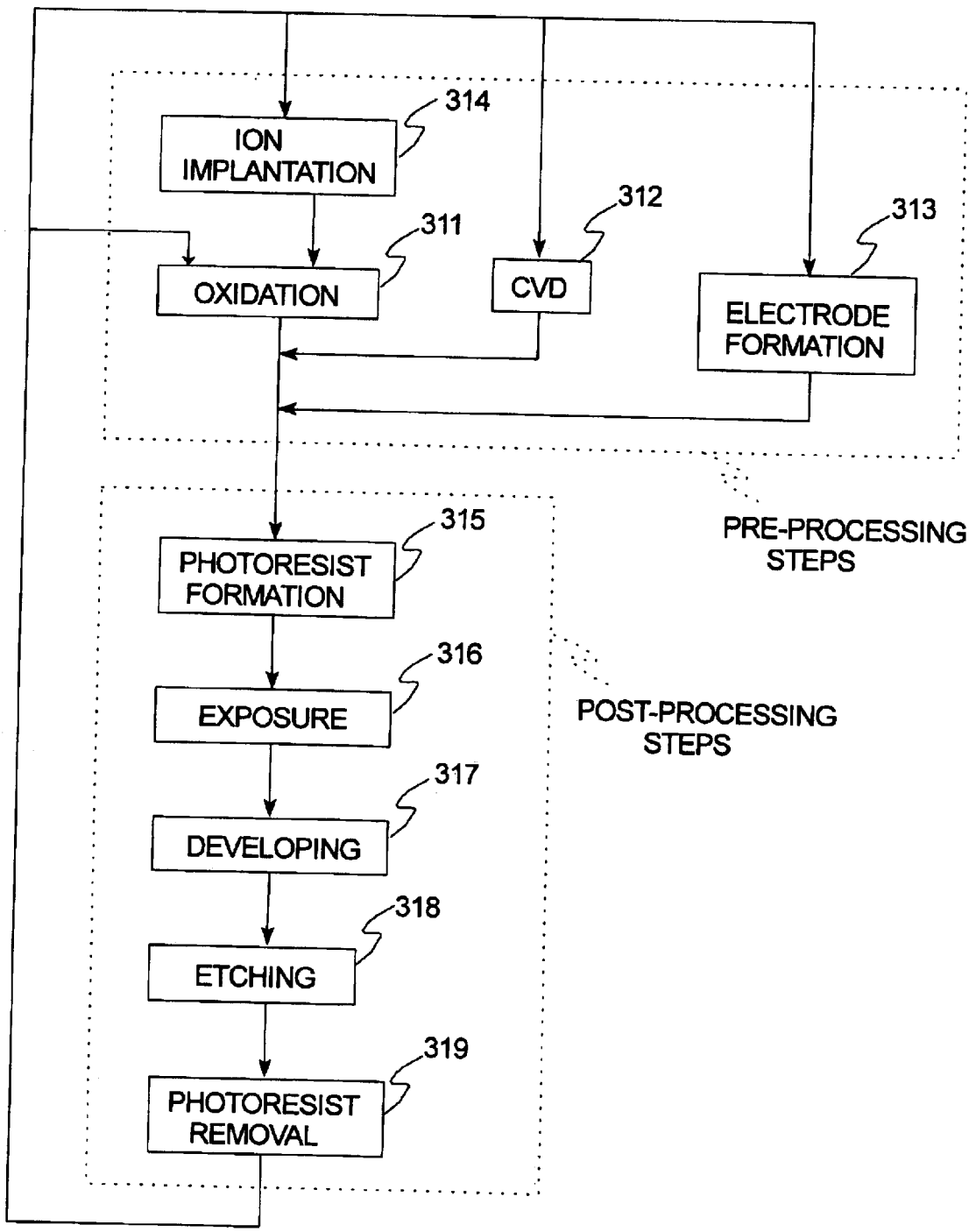
FIG. 7 is a flow chart that outlines device processing in more detail.

FIG. 7 illustrates a detailed flowchart example of the above-mentioned step 304 in the case of fabricating semiconductor devices. In FIG. 7, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device along an X axis between a first region, a transition region, and a second region, the stage assembly comprising:
 a device table that retains the device;
 a X mover connected to the device table and moving the device table along the X axis;
 a measurement system that monitors the position of the device table, the measurement system including a first X system that provides a first X position signal that indicates the position of the device table along the X axis when the device table is in the first region and a second X system that provides a second X position signal that indicates the position of the device table along the X axis when the device table is in second region; and
 a control system connected to the X mover and the measurement system, the control system receiving the X position signals from the X systems and directs current to the X mover to move the device table along the X axis from the first region to the second region with a plurality of servo, cycles, wherein the control system switches from the first X system to the second X system within a predetermined number of servo cycles in the transition region.

2. The stage assembly of claim 1 wherein the first X system indicates the position of the device table along the X axis when the device table is in the transition region and the second X system indicates the position of the device table along the X axis when the device table is in the transition region.

3. The stage assembly of claim 1 wherein the control system directs current to the X mover so that the device table is moving at an approximately constant velocity along the X axis while switching from, the first X system to the second X system.

4. The stage assembly of claim 1 wherein the control system utilizes the first X position signal from the first X system to control, the X mover prior to the switching of position signals and the, control system utilizes the second, X position signal from the second X system to control the X mover after the switching of position signals.

5. The stage assembly of claim 1 wherein the control system offsets the second X position signal to approximately match the first X position signal.

6. The stage assembly of claim 1 wherein the control system offsets the second X position signal to approximately match the first X position signal within one servo cycle.

7. The stage assembly of claim 1 further comprising a Y mover connected to the device table and moving the device table along a Y axis.

8. The stage assembly of claim 7 wherein the measurement system includes a first Y system that provides a first Y position signal that indicates the position of the device table along the Y axis in the first region and a second Y system that provides a second Y position signal that indicates the position of the device table along the Y axis in the second region; wherein the control system receives the Y position signals from the measurement system and directs current to the Y mover to move the device table along the Y axis.

9. The stage assembly of claim 8 wherein the measurement system includes a third Y system that provides a third Y position signal that indicates the position of the device table along the Y axis in the first region, the transition region and the second region; and wherein the control system switches from the first Y system to the third Y system in the first region.

10. The stage assembly of claim 9 wherein the control system directs current to the Y mover so that the device table is moving at an approximately constant velocity along the Y axis before and after the switching between the first Y system and the third Y system.

11. The stage assembly of claim 9 wherein the control system utilizes the first Y position signal from the first Y system to control the Y mover prior to the switch from the first Y system to the third Y system and the control system utilizes the third Y position signal from the third Y system to control the Y mover after the switch from the first Y system to the third Y system.

12. The stage assembly of claim 11 wherein the control system switches from the third Y system to the second Y system in the second region and the control system utilizes the third Y position signal from the third Y system third Y system to control the Y mover prior to the switch from the system to the second Y system and the control system utilizes the second Y position signal from the second Y system to control the Y mover after the switch from the third Y system to the second Y system.

13. The stage assembly of claim 9 wherein the control system offsets the third Y position signal to approximately match the first Y position signal within one servo cycle.

14. The stage assembly of claim 13 wherein the control system adjusts the second Y position signal to be approximately equal to third Y position signal within one servo cycle.

15. An exposure apparatus including the stage assembly of claim 1.

16. A device manufactured with the exposure apparatus according to claim 15.

17. A wafer on which an image has been formed by the exposure apparatus of claim 15.

18. The stage assembly of claim 1, wherein the control system switches from the first X system to the second X system within one servo cycle in the transition region.

19. The stage assembly of claim 18 wherein the one servo cycle lasts between approximately 0.1 and 1 milliseconds.

20. The stage assembly of claim 1 wherein the first X system does not provide the first X position signal that indicates the position of the device table along the X axis during at least a portion of the period when the device table is in the second region.

21. The stage assembly of claim 1 wherein the second X system does not provide the second X position signal that indicates the position of the device table along the X axis during at least a portion of the period when the device table is in the first region.

22. A stage assembly that moves a device along an X axis and a Y axis between a first region, a transition region, and a second region, the stage assembly comprising:

a device table that retains the device;

an X mover connected to the device table and moving the device table along the X axis;

a Y mover connected to the device table and moving the device table along the Y axis;

a measurement system that monitors the position of the device table, the measurement system including a first X system that provides a first X position signal that indicates the position of the device table along the X axis when the device table is in the first region and the transition region, a second X system that provides a second X position signal that indicates the position of the device table along the X axis when the device table is in second region and the transition region, a first Y system that provides a first Y position signal that indicates the position of the device table along the Y axis when the device table is in the first region and a second Y system that provides a second Y position signal that indicates the position of the device table along the Y axis when the device table is in second region; and a control system connected to the X mover, the Y mover, and the measurement system, the control system receiving the position signals from the systems and directs current to the movers to move the device table along the X axis and along the Y axis from the first region to the second region with a plurality of servo cycles, wherein the control system switches from the first X system to the second X system within a predetermined number of servo cycles when the device table is in the transition region.

23. The stage assembly of claim 22 wherein the control system directs current to the X mover so that the device table is moving at an approximately constant velocity along the X axis before and after the switching between the X systems.

24. The stage assembly of claim 22 wherein the control system utilizes the first X position signal from the first X system to control the X mover prior to the switching between the X system and the control system utilizes the second X position signal from the second X system to control the X mover after the switching between the X system systems.

25. The stage assembly of claim 22 wherein the control, system offsets the second X position signal to approximately match the first X position signal within one servo cycle.

26. The stage assembly of claim 22 wherein the measurement system includes a third Y system that provides a third Y position signal that indicates the position of the device table along the Y axis in the first region, transition region and the second region.

27. The stage assembly of claim 26 wherein the control system switches from the first Y system to the third Y system in the first region, and the control system utilizes the first Y position signal from the first Y system to control the Y mover prior to switching and the control system utilizes the third Y position signal from the third Y system to control the Y mover after switching of position signals.

28. The stage assembly of claim 27 wherein the control system switches from the third Y system to the second Y system in the second region, and the control system utilizes the third Y position signal from the third Y system to control the Y mover prior to switching and the control system utilizes the second Y position signal from the second Y systemic control the Y mover after the switching of position signals.

29. The stage assembly of claim 28 wherein the control system directs current to the Y mover so that the device table is moving at an approximately constant velocity along the Y axis before and after the switching of position signals.

30. The stage assembly of claim 28 wherein the control system offsets the second Y position signal, to approximately match the third Y position signal within one servo cycle.

31. The stage assembly of claim 27 wherein the control system adjusts the third Y position signal to be approximately equal to first Y position signal during the position signal switch.

32. An exposure apparatus including the stage assembly of claim 22.

33. A device manufactured with the exposure apparatus according to claim 32.

34. A wafer on which an image has been formed by the exposure apparatus of claim 32.

35. The stage assembly of claim 22, wherein the control system switches from the first X system to the second X system within one servo cycle when the device table is in the transition region.

36. A stage assembly that moves a device along an X axis between a first region, a transition region, and a second region, the stage assembly comprising:

a device table that retains the device;

a X mover connected to the device table and moving the device table along the X axis;

a measurement system that monitors the position of the device table, the measurement system including a first X system that provides a first X position signal that indicates the position of the device table along the X axis when the device table is in the first region and a second X system that provides a second X position signal that indicates the position of the device table along the X axis when the device table is in second region; and a control system connected to the X mover and the measurement system, the control system receiving the X position signals from the X systems and directs current to the X mover to move the device table along the X axis from the first region to the second region with a plurality of servo cycles, wherein the control system does not direct current to the X mover during a predetermined number of servo cycles when the device table is in the transition region.

37. The stage assembly of claim 36 wherein the first X system indicates the position of the device table along the X axis when the device table is in the transition region and the second X system indicates the position of the device table along the X axis when the device table is in the transition region.

38. The stage assembly of claim 36 wherein the control system offsets the second X position signal to approximately match the first X position signal.

39. The stage assembly of claim 36 wherein the control system offsets the second X position signal to approximately match the first X position signal within one servo cycle.

40. The stage assembly of claim 36 wherein the control system flushes previous X position signals from the X systems within one servo cycle.

41. The stage assembly of claim 36 further comprising a Y mover connected to the device table and moving the device table along a Y axis.

42. The stage assembly of claim 41 wherein the measurement system includes a first Y system that provides a first Y position signal that indicates the position of the device table along the Y axis in the first region and, a second Y system that provides a second Y position signal that indicates the position of the device table along the Y axis in the second region; wherein the control system receives the Y position signals from the measurement system and directs current to the Y mover to move the device table along the Y axis; and wherein the control system does not direct current to the Y mover for at least one servo cycle when the device table is in the transition region.

43. The stage assembly of claim 42 wherein the measurement system includes a third Y system that provides a third Y position signal that indicates the position of the device table along the Y axis in the first region, transition region and the second region; and wherein the control system does not direct current to the Y mover for at least one servo cycle when the device table is in the transition region.

44. The stage assembly of claim 43 wherein the control system directs current to the Y mover so that the device table is moving at an approximately constant velocity along the Y axis immediately prior to each of the skipped servo cycles.

45. The stage assembly of claim 43 wherein the control system utilizes the first Y position signal from the first Y system to control the Y mover prior to at least one skipped servo cycle and the control system utilizes the third Y position signal from the third Y system to control the Y mover after at least one skipped servo cycle.

46. The stage assembly of claim 45 wherein the control system utilizes the third Y position signal from the third Y system to control the Y mover prior to one of the skipped servo cycles and the control system utilizes the second Y position signal from the second Y system to control the Y mover after one of the skipped servo cycles.

47. The stage assembly of claim 43 wherein the control system offsets the third Y position signal to approximately match the first Y position signal during one of the skipped servo cycles.

48. The stage assembly of claim 47 wherein the control system offsets the second Y position signal to approximately match the third Y position signal during one of the skipped servo cycles.

49. An exposure apparatus including the stage assembly of claim 36.

50. A device manufactured with the exposure apparatus according to claim 49.

51. A wafer on which an image has been formed by the exposure apparatus of claim 49.

52. The stage assembly of claim 36, wherein the control system does not direct current to the first X mover during at least one servo cycle when the device table is in the transition region.

53. The stage assembly of claim 52 wherein the control system directs current to the X mover so that the device table is moving at an approximately constant velocity along the X axis immediately prior to the at least one skipped servo cycle.

54. The stage assembly of claim 52 wherein the control system utilizes the first X position signal from the first X system to control the X mover prior to the at least one skipped servo cycle and the control system utilizes the second X position signal from the second X system to control the X mover after the at least one skipped servo cycle.

55. The stage assembly of claim 54 wherein the at least one skipped servo cycle lasts between approximately 0.1 and 1 milliseconds.

56. The stage assembly of claim 36 wherein the first X system does not provide the first X position signal that indicates the position of the device table along the X axis during at least a portion of the period when the device table is in the second region, and wherein the second X system does not provide the second X position signal that indicates the position of the device table along the X axis during at least a portion of the period when the device table is in the first region.

57. A stage assembly that moves a device along an X axis and a Y axis between a first region, a transition region, and a second region, the stage assembly comprising:

a device table that retains the device;

a Y mover connected to the device table and moving the device table along the Y axis;

a measurement system that monitors the position of the device table, the measurement system including a first Y system that provides, a first Y position signal that indicates the position of the device table along the Y axis when the device table is in the first region, a second Y system that provides a second Y position signal that indicates the position of the device table along the Y axis when the device table is in second region and a third Y system that provides a third Y position signal when the device table is in the first region, the second region and the transition region; and a control system connected to the Y mover and the measurement system, the control system receiving the position signals from the Y systems and directing current to the Y mover to move the device table along the Y axis from the first region to the second region with a plurality of servo cycles, wherein the control system switches from the first Y system to the third Y system within a predetermined number of servo cycles when the device table is in the first region.

58. The stage assembly of claim 57 wherein the control system directs current to the Y mover so that the device table is moving at an approximately constant velocity along the X axis before and after the switching of between the Y systems.

59. The stage assembly of claim 57 wherein the control system utilizes the first Y position signal from the first Y system to control the Y mover prior to the switching between the Y systems and the control system utilizes the third Y position signal from the third Y system to control the Y mover after the switching between the Y systems.

60. The stage assembly of claim 59 wherein the control system offsets the third Y position signal to approximately match the first Y position signal within one servo cycle.

61. The stage assembly of claim 57 wherein the control system switches from the third Y system to the second Y system within one servo cycle when the device table is in the second region and the control system utilizes the third Y position signal from the third Y system to control the Y mover prior to switching and the control system utilizes the second Y position signal from the second Y system to control the Y mover after the switching of position signals.

62. The stage assembly of claim 61 wherein the control system offsets the second Y position signal to approximately match the third Y position signal within one servo cycle.

63. An exposure apparatus including the stage assembly of claim 57.

64. A device manufactured with the exposure apparatus according to claim 63.

65. A wafer on which an image has been formed by the exposure apparatus of claim 63.

66. The stage assembly of claim 57, wherein the control system switches from the first Y system to the third Y system within one servo cycle when the device table is in the first region.

67. A method for making a stage assembly for moving a device along an X axis between a first region, a transition region, and a second region, the method comprising the steps of:

providing a device table that retains the device;

connecting an X mover to the device table, the X mover moving the device table along the X axis;

providing a measurement system, the measurement system including a first X system that provides a first X position signal that indicates the position of the device table along the X axis when the device table is in the first region and a second X system that provides a second X position signal that indicates the position of the device table along the X axis when the device table is in second region; and connecting a control system to the X mover and the measurement system; wherein the control system switches between the X systems during a predetermined number of servo cycles when the device table is in the transition region.

68. The method of claim 67, wherein the control system directs current to the X mover so that the device table is moving at an approximately constant velocity along the X axis while during the switching of the X systems.

69. The method of claim 67 wherein the control system utilizes the first X position signal from the first X system to control the X mover prior to the switching of the X systems and the control system utilizes the second X position signal from the second X system to control the X mover after the switching of X systems.

70. The method of claim 69, wherein the control system offsets the second X position signal to approximately match the first X position signal during switching of X systems.

71. The method of claim 67 further comprising the step of connecting a Y mover to the device table, the Y mover moving the device table along a Y-axis.

72. The method of claim 71 wherein the measurement system includes a first Y system that provides a first Y position signal that indicates the position of the device table along the Y axis in the first region, a second Y system that provides a second Y position signal that indicates the position of the device table along the Y axis in the second region and a third Y system that provides a third Y position signal that indicates the position of the device table along the Y axis in the first region, transition region and the second region.

73. The method of claim 72, wherein the control system switches between the Y systems during movement of the device table alone the Y axis, and wherein the control system directs current to the Y mover so that the device table is moving at an approximately constant velocity along the Y axis before and after switching between Y systems.

74. The method of claim 73, wherein the control system offsets the third Y position signal to approximately match the first Y position signal during switching between the first Y system and the third Y system.

75. The method of claim 74, wherein the control system adjusts the second Y position signal to be approximately equal to third Y position signal during switching between the third Y system and the second Y system.

76. A method for making an exposure apparatus that forms an image on a wafer, the method comprising the steps of:

providing an irradiation apparatus that irradiates the wafer with radiation to form the image on the wafer; and providing the stage assembly made by the method of claim 60.

77. A method of making a wafer utilizing the exposure apparatus made by the method of claim 76.

78. A method of making a device including at least the exposure process: wherein the exposure process utilizes the exposure apparatus made by the method of claim 76.

79. The stage assembly of claim 67 wherein the control system switches between the X systems during one servo cycle when the device table is in the transition region.

80. The method of claim 67 wherein the first X system does not provide the first X position signal that indicates the position of the device table along the X axis during at least a portion of the period when the device table is in the second region, and wherein the second X system does not provide the second X position signal that indicates the position of the device table along the X axis during at least a portion of the period when the device table is in the first region.

* * * * *

UNITED STATES PATENT AND TRADEMARK OFFICE
CERTIFICATE OF CORRECTION

PATENT NO.    : 6,801,300 B2
DATED         : October 5, 2004
INVENTOR(S)   : Peterson et al.

It is certified that error appears in the above-identified patent and that said Letters Patent is hereby corrected as shown below:

Column 18,
Line 11, please delete the phrase "servo, cycles" and substitute therefore -- servo cycles --.
Line 23, please delete the phrase "from, the" and substitute therefore -- from the --.
Line 27, please delete the phrase "control, the" and substitute therefore -- control the --.
Line 28, please delete the phrase "the, control" and substitute therefore -- the control --.
Liens 28-29, please delete the phrase "second, X position" and substitute therefor -- second X postion --.

Column 19,
Lines 4-5, after the phrase "signal from the", please delete the phrase "third Y system".
Lines 5-6, after the phrase "switch from the", please insert -- third Y --.

Column 20,
Line 17, after the phrase "the control", please delete the ",".
Line 38, please delete the phrase "systemic" and substitute therefore -- system to --.
Line 45, after the phrase "position signal", please delete the ",".

Column 21,
Line 40, please delete the phrase "and, a" and substitute therefore -- and a --.

Column 22,
Line 55, please delete the pharse "provides, a" and substitute therefor -- provides a --.
Line 60, after the phrase "table is in", please insert the word -- the --.

Column 23,
Line 9, after the phrase "the switching", please delete the word "of".
Line 57, please delete the ";" and substitute therefore -- , --.

UNITED STATES PATENT AND TRADEMARK OFFICE
CERTIFICATE OF CORRECTION

PATENT NO. : 6,801,300 B2
DATED : October 5, 2004
INVENTOR(S) : Peterson et al.

It is certified that error appears in the above-identified patent and that said Letters Patent is hereby corrected as shown below:

Column 24,
Line 2, after the phrase "axis", please delete the word "while".
Line 14, please replace "Y-axis" with -- Y axis --.
Line 44, please delete "60" and substitute therefore -- 67 --.
Line 50, after "67" please insert -- , --.

Signed and Sealed this

Eighteenth Day of January, 2005

JON W. DUDAS
*Director of the United States Patent and Trademark Office*